United States Patent
Chang et al.

(10) Patent No.: US 7,511,633 B2
(45) Date of Patent: Mar. 31, 2009

(54) EXTENSION CORD CAPABLE OF PROVIDING ESTIMATED POWER COSTS INCURRED BY AN ELECTRICAL APPLIANCE PLUGGED THEREINTO

(76) Inventors: Chia-Ming Chang, 2F, No. 9, Chung-Hsing S. St., San-Chung City, Taipei Hsien (TW); Chun-Hon Lin, 2F, No. 9, Chung-Hsing S. St., San-Chung City, Taipei Hsien (TW)

( * ) Notice: Subject to any disclaimer, the term of this patent is extended or adjusted under 35 U.S.C. 154(b) by 192 days.

(21) Appl. No.: 11/483,200

(22) Filed: Jul. 7, 2006

(65) Prior Publication Data

US 2007/0027823 A1 Feb. 1, 2007

(30) Foreign Application Priority Data

Jul. 11, 2005 (TW) .............................. 94123374 A

(51) Int. Cl.
*G08C 19/22* (2006.01)
(52) U.S. Cl. .............................. 340/870.07; 340/825.69; 361/601; 361/622; 307/139; 307/140
(58) Field of Classification Search ............ 340/870.07, 340/825.69; 341/176; 307/139, 140; 361/601, 361/622
See application file for complete search history.

(56) References Cited

U.S. PATENT DOCUMENTS

| | | | | |
|---|---|---|---|---|
| 5,231,310 A | * | 7/1993 | Oh .............................. | 307/142 |
| 5,731,763 A | * | 3/1998 | Herweck et al. ........ | 340/825.69 |
| 2005/0094786 A1 | * | 5/2005 | Ossa .......................... | 379/111 |
| 2006/0176643 A1 | * | 8/2006 | Pecore ....................... | 361/230 |

* cited by examiner

*Primary Examiner*—Timothy Edwards, Jr.
(74) *Attorney, Agent, or Firm*—Ladas & Parry, LLP

(57) ABSTRACT

A method for providing estimated power costs incurred by an electrical appliance, which is plugged into a receptacle of an extension cord, includes enabling operation of the extension cord so as to measure electric current flowing through a receptacle, so as to compute an amount of electricity consumed by the electrical appliance within a predetermined period of time based on the electric current measured by the extension cord, so as to compute the estimated power costs incurred by the electrical appliance based on the amount of electricity computed by the extension cord, and so as to inform the costs computed by the extension cord to a user. An extension cord that performs the method is also disclosed.

16 Claims, 6 Drawing Sheets

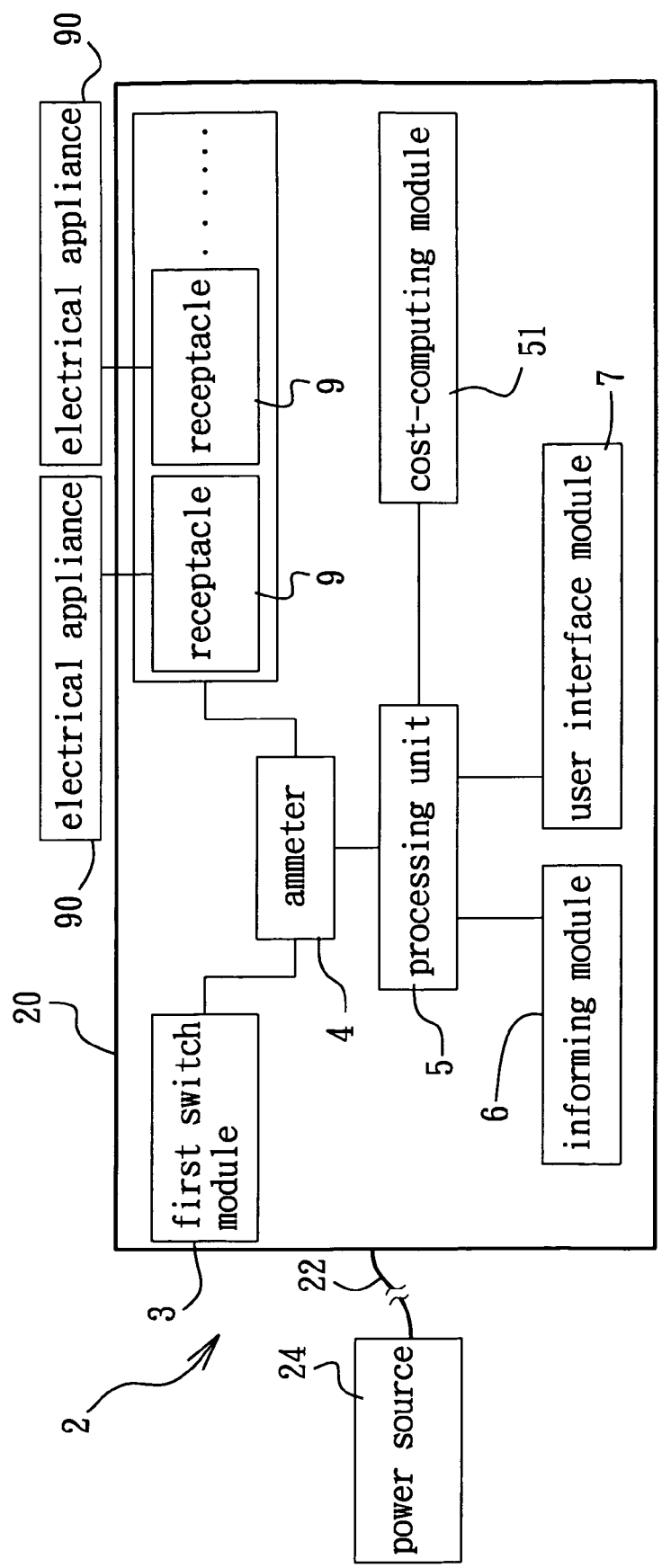
F I G. 2

EXTENSION CORD CAPABLE OF PROVIDING ESTIMATED POWER COSTS INCURRED BY AN ELECTRICAL APPLIANCE PLUGGED THEREINTO

CROSS-REFERENCE TO RELATED APPLICATION

This application claims priority of Taiwanese application no. 094123374, filed on Jul. 11, 2005.

BACKGROUND OF THE INVENTION

1. Field of the Invention

The invention relates to an extension cord, more particularly to a multi-function extension cord.

2. Description of the Related Art

FIG. 1 illustrates a conventional extension cord 1 that is used to extend the length of a power cord (not shown) of an electrical appliance (not shown) when the power cord of the electrical appliance is not long enough to reach a wall outlet (not shown).

The conventional extension cord 1 is disadvantageous in that it has no other usage aside from the one mentioned above.

SUMMARY OF THE INVENTION

Therefore, the object of the present invention is to provide an extension cord that has an additional function aside from merely extending a power cord of an electrical appliance.

According to one aspect of the present invention, a method for providing estimated power costs incurred by an electrical appliance is to be implemented using an extension cord, which includes a receptacle that is coupled to a power cord of the electrical appliance, and an electric cord that couples the receptacle to a power source, and comprises enabling operation of the extension cord so as to measure electric current flowing through the receptacle, so as to compute an amount of electricity consumed by the electrical appliance within a predetermined period of time based on the electric current measured by the extension cord, so as to compute the estimated power costs incurred by the electrical appliance based on the amount of electricity computed by the extension cord, and so as to inform the costs computed by the extension cord to a user.

According to another aspect of the present invention, an extension cord comprises a receptacle, an electric cord, an ammeter, a processing unit, a cost-computing module, and an informing module. The receptacle is adapted to be coupled to a power cord of an electrical appliance. The electric cord is adapted for coupling the receptacle to a power source. The ammeter is coupled to the receptacle, and is operable so as to measure electric current flowing through the receptacle. The processing unit is coupled to the ammeter. The cost-computing module is coupled to and is controlled by the processing unit to compute an a mount of electricity consumed by the electrical appliance within a predetermined period of time based on the electric current measured by the ammeter, and to compute estimated power costs incurred by the electrical appliance based on the amount of electricity computed thereby. The informing module is coupled to and is controlled by the processing unit to inform the costs to a user.

BRIEF DESCRIPTION OF THE DRAWINGS

Other features and advantages of the present invention will become apparent in the following detailed description of the preferred embodiment with reference to the accompanying drawings, of which:

FIGS. 2 and 3 are block diagrams of the preferred embodiment of an extension cord according to the present invention.

DETAILED DESCRIPTION OF THE PREFERRED EMBODIMENT

Figure 1:
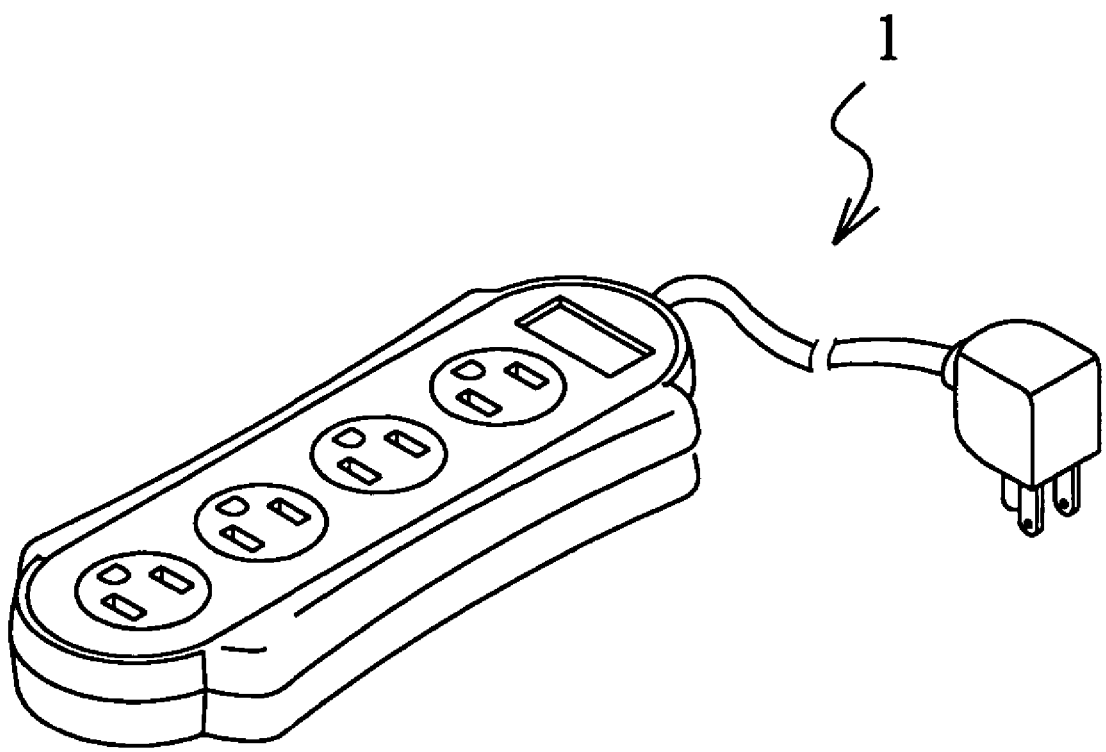
FIG. 1 is a fragmentary perspective view of a conventional extension cord.
Figure 3:
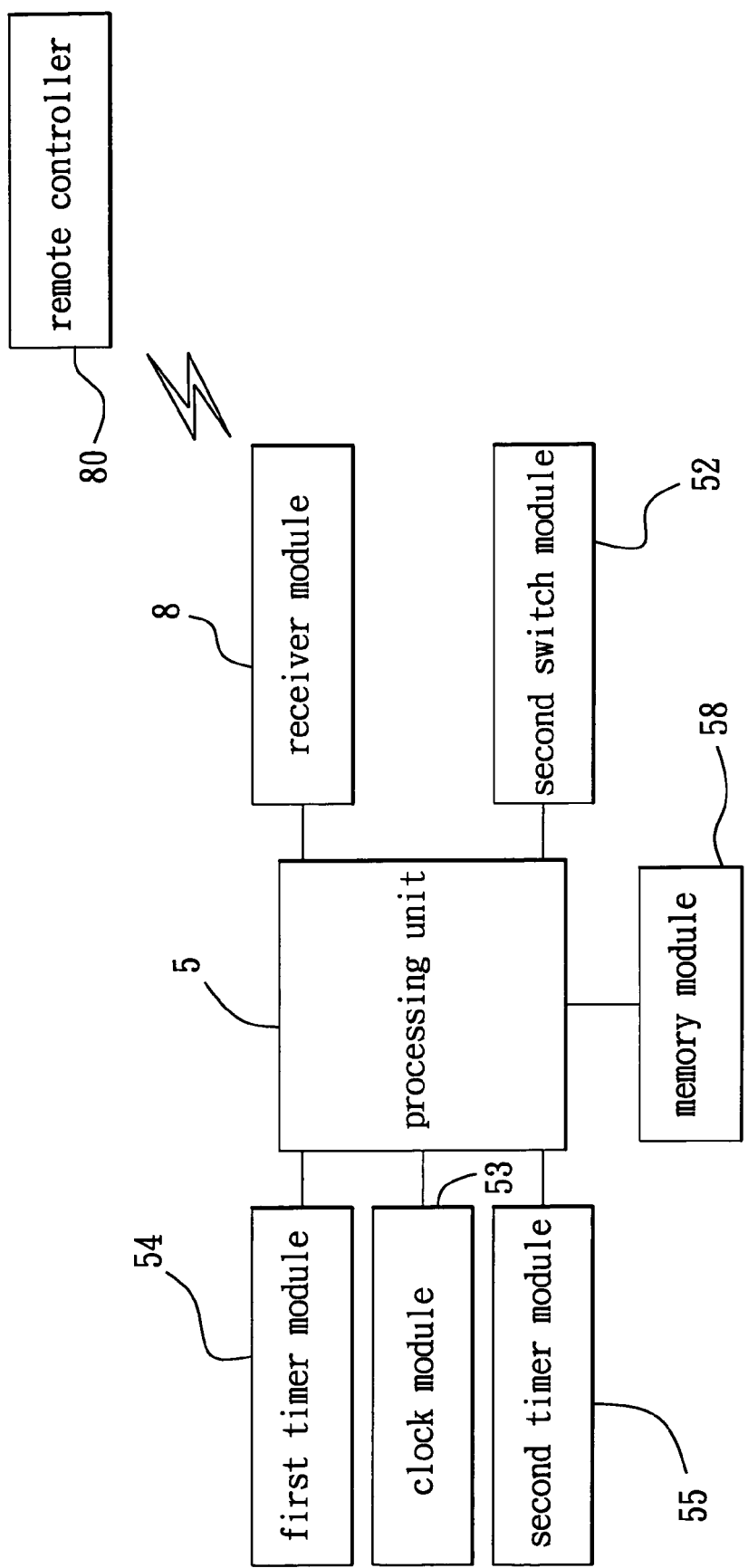

Referring to FIGS. 2 and 3, the preferred embodiment of an extension cord 2 according to this invention is shown to include a plurality of receptacles 9, an electric cord 22, an ammeter 4, a processing unit 5, a cost-computing module 51, and an informing module 6, such as a display unit.

Each of the receptacles 9 is to be coupled to a respective one of electrical appliances 90.

The electric cord 22 couples the receptacles 9 to a power source 24, such as a commercial alternating current (AC) power source.

The ammeter 4 is coupled to the receptacles 9, and is operable so as to measure electric current flowing through the receptacles 9.

The processing unit 5 is coupled to the ammeter 4.

The cost-computing module 51 is coupled to and is controlled by the processing unit 5 to compute an amount of electricity consumed by the electrical appliances 90 within a predetermined period of time based on the electric current measured by the ammeter 4, and to compute estimated power costs incurred by the electrical appliances 90 based on the amount of electricity computed thereby.

The informing module 6 is coupled to and is controlled by the processing unit 5 to inform, e.g., by showing, the costs to a user.

The extension cord 2 further includes a user interface module 7 that is coupled to the processing unit 5, that is operable so as to control selection of languages by the processing unit 5, and that permits the user to interact with the extension cord 2 in the selected language. In this embodiment, the languages available for selection by the user are English, Chinese, Spanish, French, Japanese, and German.

The user interface module 7 is further operable so as to enable the processing unit 5 to set the predetermined period of time, and so as to control selection of monetary units by the processing unit 5 in which the computed costs are informed to the user.

The extension cord 2 further includes a first switch module 3 coupled to and controlled by the processing unit 5 to permit the flow of electric current through the receptacles 9 at a regular time interval.

The extension cord 2 further includes a first timer module 54 coupled to and controlled by the processing unit 5 to measure the regular time interval.

The user interface module 7 is further operable so as to enable the processing unit 5 to set the regular time interval.

The informing module 6 is further controlled by the processing unit 5 to show the regular time interval while being set.

The first switch module 3 is further controlled by the processing unit 5 to permit the flow of electric current through the receptacle 9 within a countdown time interval.

The extension cord 2 further includes a second timer module 55 coupled to and controlled by the processing unit 5 to measure the countdown time interval. In this embodiment, the second timer module 55 is a countdown timer module.

The user interface module 7 is further operable so as to enable the processing unit 5 to set the countdown time interval.

The informing module 6 is further controlled by the processing unit 5 to show the countdown time interval while being set.

The extension cord 2 further includes a clock module 53 coupled to and controlled by the processing unit 5 to generate current date and time.

The user interface module 7 is further operable so as to enable the processing unit 5 to set the current date and time of the clock module 53.

The informing module 6 is further controlled by the processing unit 5 to show the current date and time while the clock module 53 is being set.

The user interface module 7 is further operable so as to enable the processing unit 5 to control the informing module 6 to show the current date and time of the clock module 53.

The extension cord 2 further includes a receiver module 8 that is coupled to the processing unit 5, and that receives control signals from a remote controller 80 for controlling operation of the processing unit 5 to activate or deactivate the first switch module 3.

The extension cord 2 further includes a second switch module 52 coupled to the receiver module 8, and coupled to and controlled by the processing unit 5 to enable or disable the receiver module 8 to receive and from receiving the control signals.

The extension cord 2 further includes a memory module 58 that is coupled to the processing unit 5, and that stores the amount of electricity consumed by the electrical appliances 90 within the predetermined period of time, the predetermined period of time set by the user, the unit cost set by the user, the number of operating hours of the electrical appliances 90, the languages available for selection by the user, the monetary units available for selection by the user, the regular time interval set by the user, and the countdown time interval set by the user.

Figure 4A:
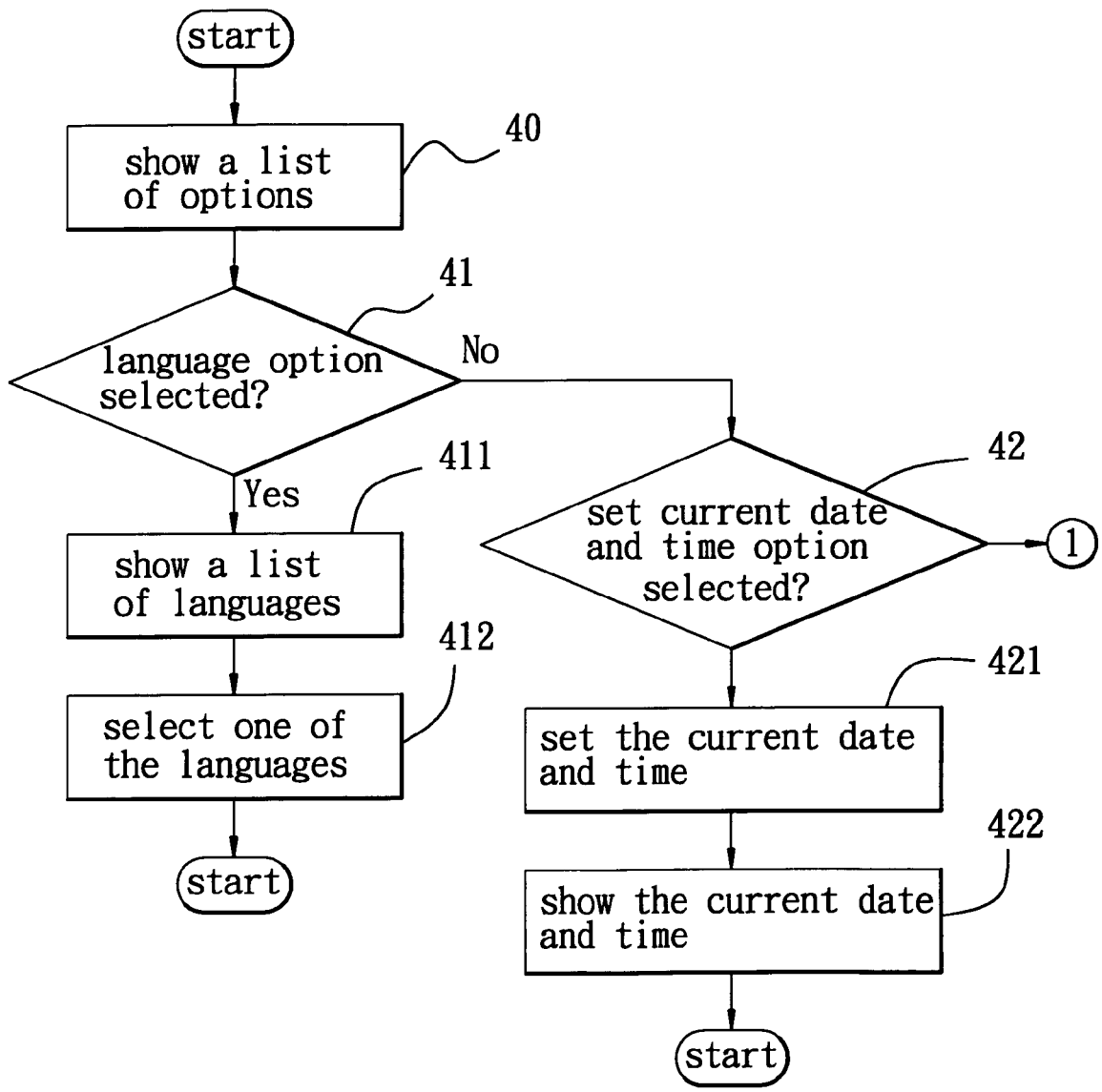
FIGS. 4A to 4C are flowcharts of the preferred embodiment of a method for providing estimated power costs incurred by an electrical appliance according to this invention.
Figure 4B:
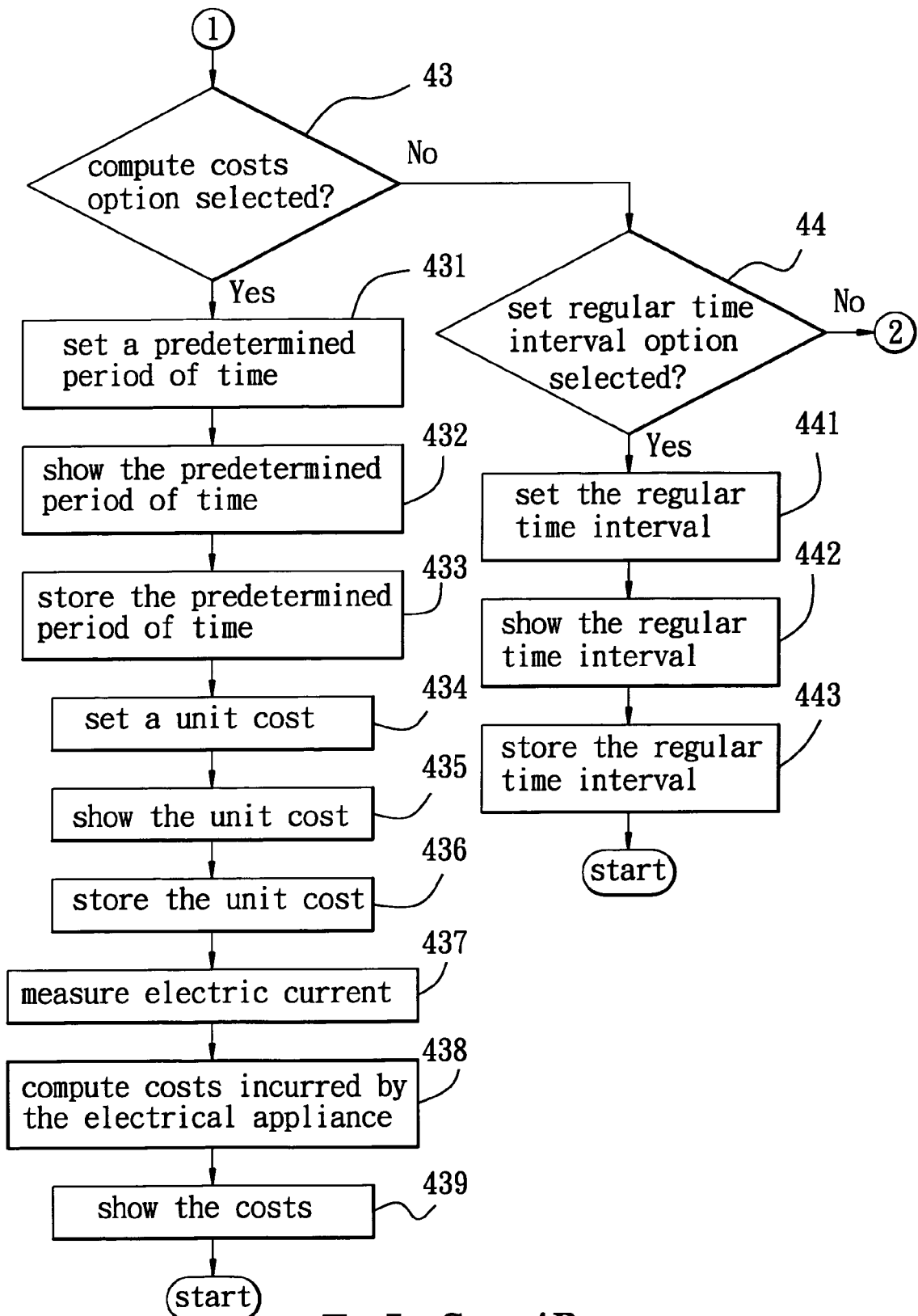
Figure 4C:
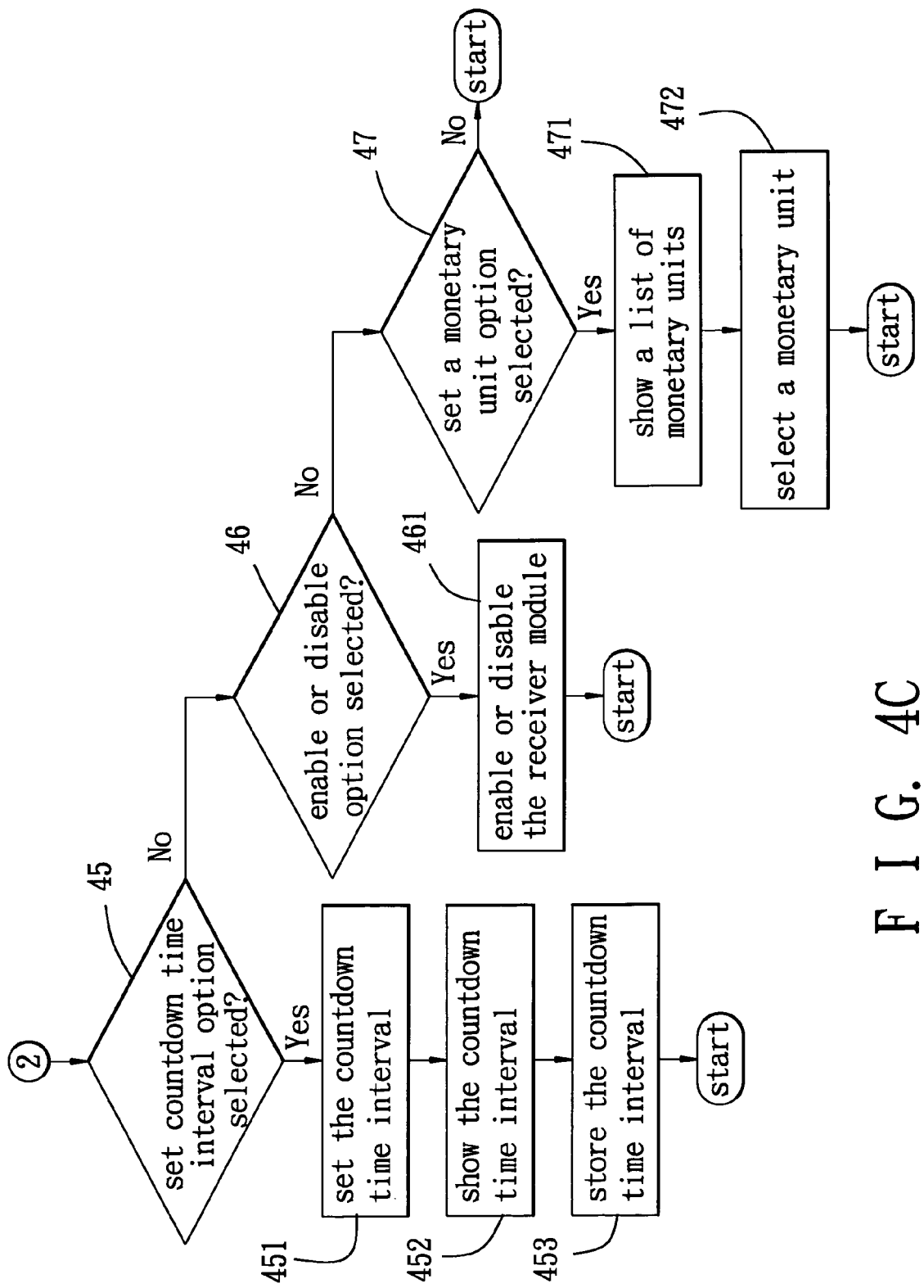

FIGS. 4A to 4C illustrate the preferred embodiment of a method for providing estimated power costs incurred by the electrical appliances 90 to be implemented using the aforementioned extension cord 2 according to this invention.

In step 40, the processing unit 5 of the extension cord 2 controls the informing module 6 of the extension cord 2 to show a list of options available for selection by the user.

In step 41, when the user chooses the option to select a language in which the extension cord 2 interacts with the user, the flow proceeds to step 411. Otherwise, the flow proceeds to step 42.

In step 411, the processing unit 5 of the extension cord 2 controls the informing module 6 of the extension cord 2 to show a list of the languages available for selection by the user.

In step 412, the processing unit 5 of the extension cord 2 allows the user to select one of the languages via the user interface module 7. Once a language is selected by the user, the flow goes back to step 40.

In step 42, when the user chooses the option to set the current date and time generated by the clock module 53, the flow proceeds to step 421. Otherwise, the flow proceeds to step 43.

In step 421, the processing unit 5 of the extension cord 2 allows the user to set the current date and time of the clock module 53 via the user interface module 7.

In step 422, the processing unit 5 of the extension cord 2 controls the informing module 6 of the extension cord 2 to show the current date and time while the clock module 53 is being set in step 421. Thereafter, the flow goes back to step 40.

In step 43, when the user chooses the option to compute the estimated power costs incurred by the electrical appliances 90, the flow proceeds to step 431. Otherwise, the flow proceeds to step 44.

In step 431, the processing unit 5 of the extension cord 2 allows the user to set the predetermined period of time, e.g. from Mar. 2, 1993 to Apr. 2, 1993, within which the amount of electricity consumed by the electrical appliances 90 is to be computed, through the user interface module 7.

In step 432, the processing unit 5 of the extension cord 2 controls the informing module 6 of the extension cord 2 to show the predetermined period of time while the latter is being set in step 431.

In step 433, the processing unit 5 of the extension cord 2 stores the predetermined period of time set in step 431 in the memory module 58 of the extension cord 2.

In step 434, the processing unit 5 of the extension cord 2 allows the user to set a unit cost through the user interface module 7.

In step 435, the processing unit 5 of the extension cord 2 controls the informing module 6 of the extension cord 2 to show the unit cost while the latter is being set in step 434.

In step 436, the processing unit 5 of the extension cord 2 stores the unit cost set in step 435 in the memory module 58 of the extension cord 2.

In step 437, the ammeter 4 of the extension cord 2 measures electric current flowing through the receptacles 9.

In step 438, the cost-computing module 51 of the extension cord 2 computes an amount of electricity consumed by the electrical appliances 90 within the predetermined period of time stored in the memory module 58 of the extension cord 2 based on the electric current measured by the ammeter 4 of the extension cord 2, and the estimated power costs incurred by the electrical appliances 90 based on the amount of electricity computed thereby and the unit cost stored in the memory module 58 of the extension cord 2.

As an example, if the power source 24 provides a voltage (V) of 100 Volts and the electric current (I) measured by the ammeter 4 of the extension cord 2 is 10 Amperes, then the amount of electricity (electric power) consumed by the electrical appliances 90 is 1000 Watts (P=VI) . Moreover, if one unit equals 1000 Watts per hour, the unit cost is $3.00, and the electrical appliances 90 were operated 40 hours within the predetermined period of time, then the costs incurred by the electrical appliances 90 are $120.00, i.e. 1 unit ×40 hours× $3.00.

In step 439, the processing unit 5 of the extension cord 2 controls the informing module 6 to show the estimated power costs computed in step 438. Thereafter, the flow goes back to step 40.

In step 44, when the user chooses the option to set the regular time interval, the flow proceeds to step 441. Otherwise, the flow proceeds to step 45.

In step 441, the processing unit 5 of the extension cord 2 allows the user to set the regular time interval via the user interface module 7.

In step 442, the processing unit 5 of the extension cord 2 controls the informing module 6 to show the regular time interval while the latter is being set in step 441.

In step 443, the processing unit 5 of the extension cord 2 stores the regular time interval set in step 441 in the memory module 58 of the extension cord 2. Upon setting the regular time interval, the first switch module 3 is thus controlled by the processing unit 5 to permit the flow of electric current through the receptacles 9 at the regular time interval. Thereafter, the flow goes back to step 40.

In step 45, when the user chooses the option to set the countdown time interval, the flow proceeds to step 451. Otherwise, the flow proceeds to step 46.

In step 451, the processing unit 5 of the extension cord 2 allows the user to set the countdown time interval via the user interface module 7.

In step 452, the processing unit 5 of the extension cord 2 controls the informing module 6 to show the countdown time interval while the latter is being set in step 451.

In step 453, the processing unit 5 of the extension cord 2 stores the countdown time interval set in step 451. Upon setting the countdown time interval, the first switch module 3 is thus controlled by the processing unit 5 to permit the flow of electric current through the receptacles 9 within the countdown time interval. Thereafter, the flow goes back to step 40.

Instep 46, when the user chooses the option to enable or disable the receiver module 8, the flow proceeds to step 461. Otherwise, the flow proceeds to step 47.

In step 461, the processing unit 5 of the extension cord 2 allows the user to enable or disable the receiver module 8. Thereafter, the flow goes back to step 40.

In step 47, when the user chooses the option to set a monetary unit in which the costs are informed to the user, the flow proceeds to step 471. Otherwise, the flow goes back to step 40.

In step 471, the processing unit 5 of the extension cord 2 controls the informing module 6 of the extension cord 2 to show a list of monetary units available for selection by the user.

In step 472, the processing unit 5 of the extension cord 2 allows the user to select one of the monetary units shown in step 472 via the user interface module 7. Once a monetary unit is selected by the user, the flow goes back step 40.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method for providing estimated power costs incurred by an electrical appliance to be implemented using an extension cord, the extension cord including a receptacle that is coupled to a power cord of the electrical appliance, and an electric cord that couples the receptacle to a power source, said method comprising:

enabling operation of the extension cord so as to measure electric current flowing through the receptacle, so as to compute an amount of electricity consumed by the electrical appliance within a predetermined period of time based on the electric current measured by the extension cord, so as to compute the estimated power costs incurred by the electrical appliance based on the amount of electricity computed by the extension cord, and so as to inform the costs computed by the extension cord to a user;

receiving a control signal adapted to control operation of the extension cord; and allowing the user to enable or disable the extension cord from receiving the control signal.

2. The method as claimed in claim 1, further comprising the step of allowing a user to set the predetermined period of time within which the amount of electricity consumed by the electrical appliance is to be computed.

3. The method as claimed in claim 1, further comprising the step of allowing a user to select a monetary unit in which the computed costs are informed to the user.

4. The method as claimed in claim 1, further comprising the step of allowing a user to select a language in which the extension cord interacts with the user.

5. The method as claimed in claim 1, further comprising the step of allowing a user to set current date and time.

6. The method as claimed in claim 1, further comprising the step of enabling operation of the extension cord so as to permit the flow of electric current through the receptacle of the extension cord at a regular time interval.

7. The method as claimed in claim 6, further comprising the step of allowing a user to set the regular time interval.

8. The method as claimed in claim 1, further comprising the step of enabling operation of the extension cord so as to permit the flow of electric current through the receptacle of the extension cord within a countdown time interval.

9. The method as claimed in claim 8, further comprising the step of allowing a user to set the countdown time interval.

10. An extension cord, comprising:

a receptacle adapted to be coupled to a power cord of an electrical appliance;

an electric cord adapted for coupling said receptacle to a power source;

an ammeter coupled to said receptacle, and operable so as to measure electric current flowing through said receptacle;

a processing unit coupled to said ammeter;

a cost-computing module coupled to and controlled by said processing unit to compute an amount of electricity consumed by the electrical appliance within a predetermined period of time based on the electric current measured by said ammeter, and to compute estimated power costs incurred by the electrical appliance based on the amount of electricity computed thereby;

an informing module coupled to and controlled by said processing unit to inform the costs to a user;

a receiver module coupled to said processing unit, and adapted to receive control signals adapted to control operation of said processing unit; and a switch module coupled to said receiver module adapted to enable and disable said receiver module to receive and from receiving the control signals.

11. The extension cord as claimed in claim 10, further comprising a user interface module coupled to said processing unit, and operable so as to enable said processing unit to set the predetermined period of time.

12. The extension cord as claimed in claim 10, further comprising a user interface module coupled to said processing unit, and operable so as to control selection of monetary units by said processing unit in which the costs are informed to the user.

13. The extension cord as claimed in claim 10, further comprising:

another switch module coupled to and controlled by said processing unit to permit the flow of electric current through said receptacle at a regular time interval;

a timer module coupled to and controlled by said processing unit to measure the regular time interval; and a user interface module coupled to said processing unit, and operable so as to enable said processing unit to set the regular time interval.

14. The extension cord as claimed in claim 10, further comprising:

another switch module coupled to and controlled by said processing unit to permit the flow of electric current through said receptacle within a countdown time interval;

a timer module coupled to and controlled by said processing unit to measure the countdown time interval; and a user interface module coupled to said processing unit, and operable so as to enable said processing unit to set the countdown time interval.

15. The extension cord as claimed in claim 10, further comprising:

a clock module coupled to and controlled by said processing unit to generate current date and time that are informed to the user through said informing module; and a user interface module coupled to said processing unit, and operable so as to enable said processing unit to set the current date and time of said clock module.

16. The extension cord as claimed in claim 10, further comprising a user interface module coupled to said processing unit, permitting a user to interact with said extension cord in a selected one of languages, and operable so as to control selection of the languages by said processing unit.

* * * * *